United States Patent
Matsuda

(10) Patent No.: US 12,526,911 B2
(45) Date of Patent: Jan. 13, 2026

(54) MULTILAYER RESIN SUBSTRATE AND ELECTRONIC COMPONENT

(71) Applicant: Murata Manufacturing Co., Ltd., Nagaokakyo (JP)

(72) Inventor: Kenji Matsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 245 days.

(21) Appl. No.: 18/524,031

(22) Filed: Nov. 30, 2023

(65) Prior Publication Data

US 2024/0237191 A1    Jul. 11, 2024

(30) Foreign Application Priority Data

Jan. 11, 2023 (JP) .................... 2023-002673

(51) Int. Cl.
*H05K 1/02*      (2006.01)

(52) U.S. Cl.
CPC ........... *H05K 1/0219* (2013.01); *H05K 1/028* (2013.01); *H05K 2201/10098* (2013.01)

(58) Field of Classification Search
CPC ................. H05K 1/0219; H05K 1/028; H05K 1/0216–0227; H05K 1/115; H05K 1/116; H05K 1/0251; H05K 2201/09781; H05K 2201/09727; H05K 2201/10098; H05K 2201/09409; H05K 3/4691

See application file for complete search history.

(56) References Cited

U.S. PATENT DOCUMENTS

| | | | |
|---|---|---|---|
| 6,762,498 B1 * | 7/2004 | Morrison | H01L 24/49 438/622 |
| 2013/0256001 A1 | 10/2013 | Sakai et al. | |
| 2021/0013608 A1 * | 1/2021 | Takayama | H01Q 5/50 |

FOREIGN PATENT DOCUMENTS

WO     2012/073669 A1    6/2012

* cited by examiner

*Primary Examiner* — Roshn K Varghese
(74) *Attorney, Agent, or Firm* — Keating & Bennett, LLP

(57) ABSTRACT

A multilayer resin substrate includes first and second substrates joined to overlap each other, a first signal electrode on a joint surface between the first and second substrates, a first via-conductor in the first substrate and joined to the first signal electrode, a first ground electrode in or on the second substrate and overlapping the first signal electrode, a first floating electrode in the second substrate and between the first signal electrode and the first ground electrode. The first signal electrode includes a first joint joined to the first via-conductor and a wiring portion extending in a signal transmission direction. In a line-width direction transverse to the signal transmission direction, the first joint has a line width greater than that of the wiring portion. When viewed in the thickness direction, the first floating electrode overlaps the first joint of the first signal electrode.

20 Claims, 4 Drawing Sheets

MULTILAYER RESIN SUBSTRATE AND ELECTRONIC COMPONENT

CROSS REFERENCE TO RELATED APPLICATIONS

This application claims the benefit of priority to Japanese Patent Application No. 2023-002673 filed on Jan. 11, 2023. The entire contents of this application are hereby incorporated herein by reference.

BACKGROUND OF THE INVENTION

1. Field of the Invention

The present disclosure relates to a multilayer resin substrate, and an electronic component.

2. Description of the Related Art

International Publication No. 2012/073669 discloses a multilayer flexible substrate including two different regions. The two different regions include a rigid region, and a flexible region with higher flexibility than the rigid region. In the multilayer flexible substrate disclosed in International Publication No. 2012/073669, filled vias disposed in the flexible region have a higher porosity than filled vias disposed in a structural layer including the rigid region. This configuration aims to ensure sufficient flexibility of the flexible region upon bending of the multilayer flexible substrate.

However, changes such as changing the porosity of vias or changing the shape of a via-receiving portion may result in problems such as deteriorated flatness due to distortion of a portion of the substrate, or increased stray capacitance within the substrate.

SUMMARY OF THE INVENTION

Preferred embodiments of the present invention provide multilayer resin substrates each with improved substrate flatness and a reduced increase in stray capacitance, and electronic components each including such multilayer resin substrates.

A multilayer resin substrate according to a preferred embodiment of the present invention includes a first substrate, a second substrate, a first signal electrode, a first via-conductor, a first ground electrode, and a first floating electrode. The first substrate and the second substrate are joined to each other in an overlapping manner in a thickness direction. The first signal electrode is provided on a joint surface between the first substrate and the second substrate. The first via-conductor is provided in the first substrate, and joined to the first signal electrode. The first ground electrode is provided in or on the second substrate, and overlaps the first signal electrode when viewed in the thickness direction. The first floating electrode is provided in the second substrate, and located between the first signal electrode and the first ground electrode in the thickness direction. The first signal electrode includes a first joint, and a wiring portion. The first joint is joined to the first via-conductor. The wiring portion extends in a signal transmission direction. In a line-width direction transverse to the signal transmission direction, the first joint has a line width greater than a line width of the wiring portion. When viewed in the thickness direction, the first floating electrode overlaps the first joint of the first signal electrode.

An electronic component according to a preferred embodiment of the present invention includes a multilayer resin substrate according to a preferred embodiment of the present invention.

Preferred embodiments of the present invention each have improved flatness of a substrate, and a reduced increase in stray capacitance.

DETAILED DESCRIPTION OF THE PREFERRED EMBODIMENTS

Preferred embodiments of multilayer resin substrates and electronic components according to the present invention are described below with reference to the accompanying drawings. The present disclosure is not limited to specific features described in the preferred embodiments below, and encompass features based on technical ideas the same as or similar to those according to the preferred embodiments.

Preferred Embodiment 1

Figure 1:
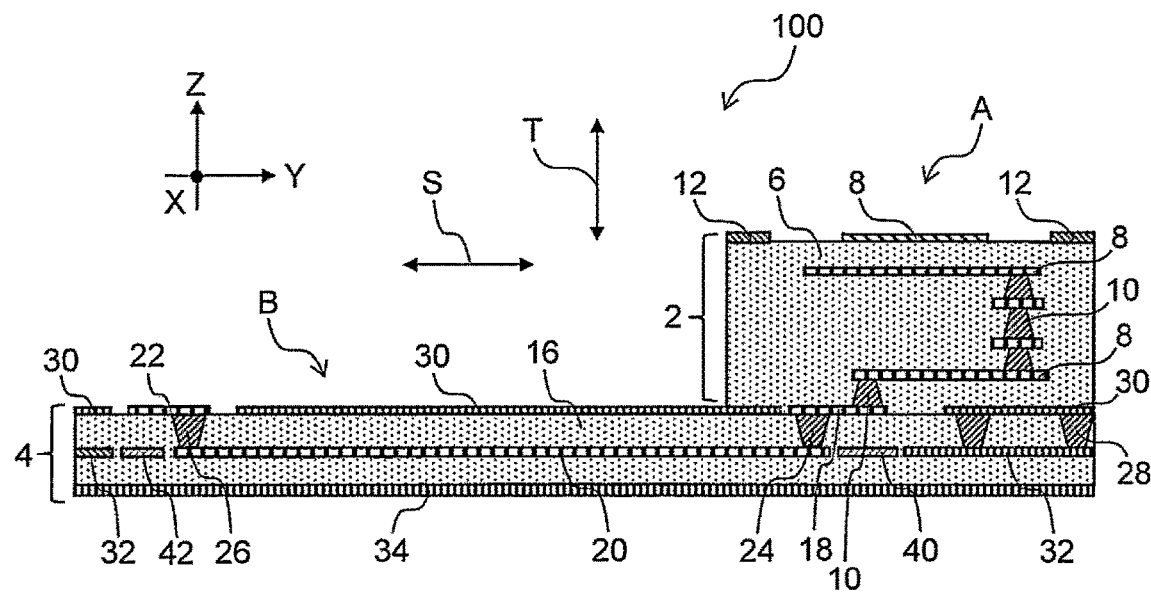
FIG. 1 is a longitudinal sectional view of a multilayer resin substrate according to Preferred Embodiment 1 of the present invention.
Figure 2:
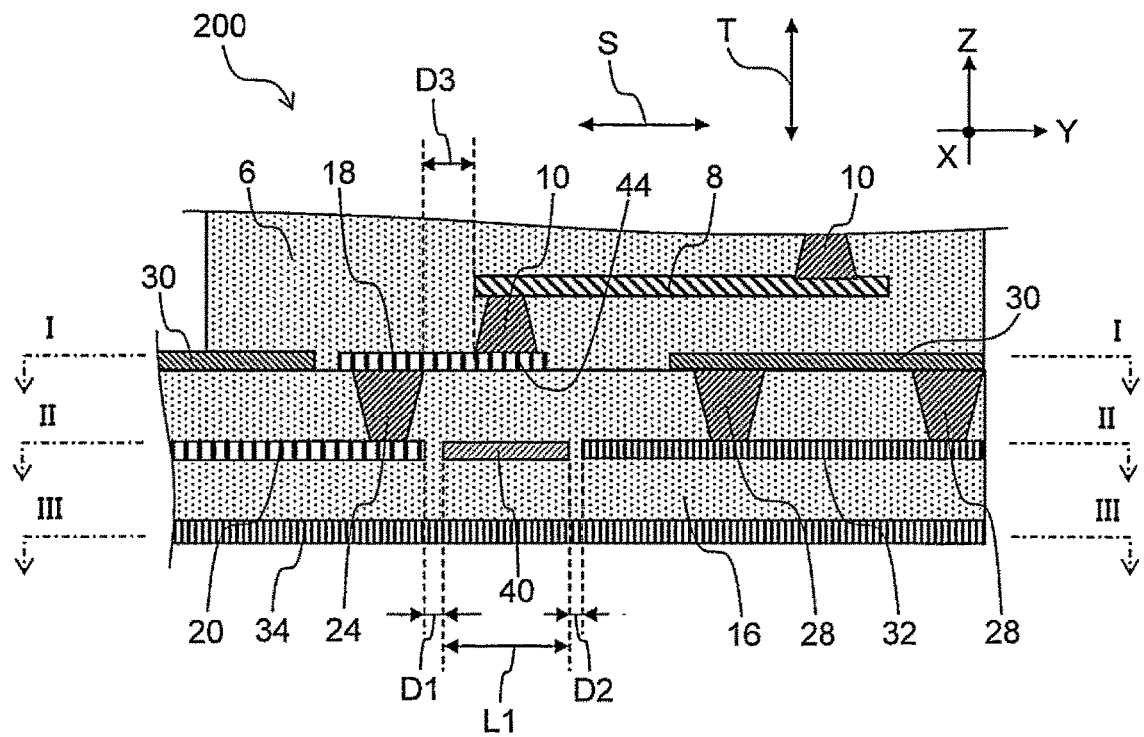
FIG. 2 is a partial enlarged view of FIG. 1.
Figure 3:
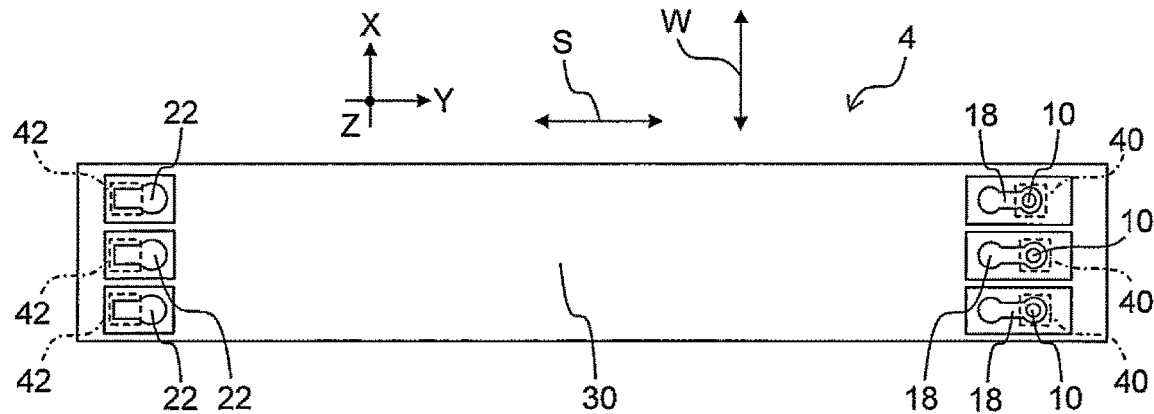
FIG. 3 is a top view of a first layer of the multilayer resin substrate according to Preferred Embodiment 1 of the present invention.
Figure 4:
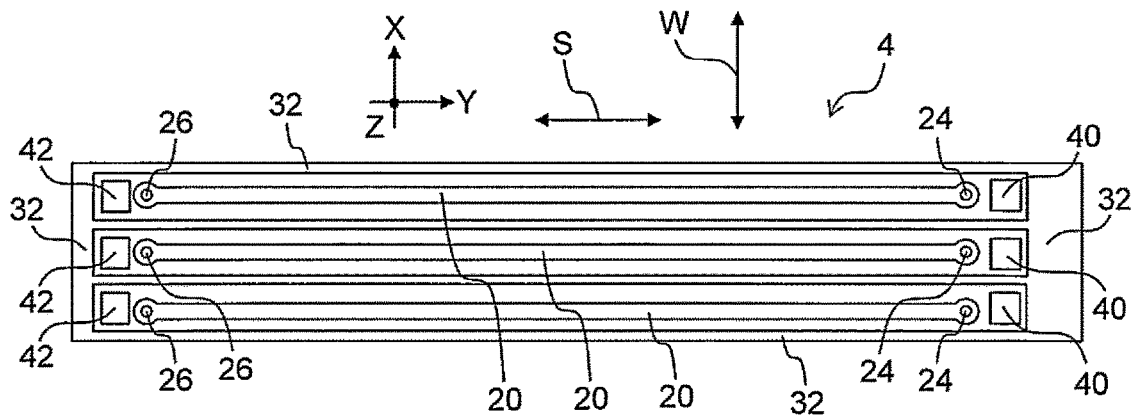
FIG. 4 is a top view of a second layer of the multilayer resin substrate according to Preferred Embodiment 1 of the present invention.
Figure 5:
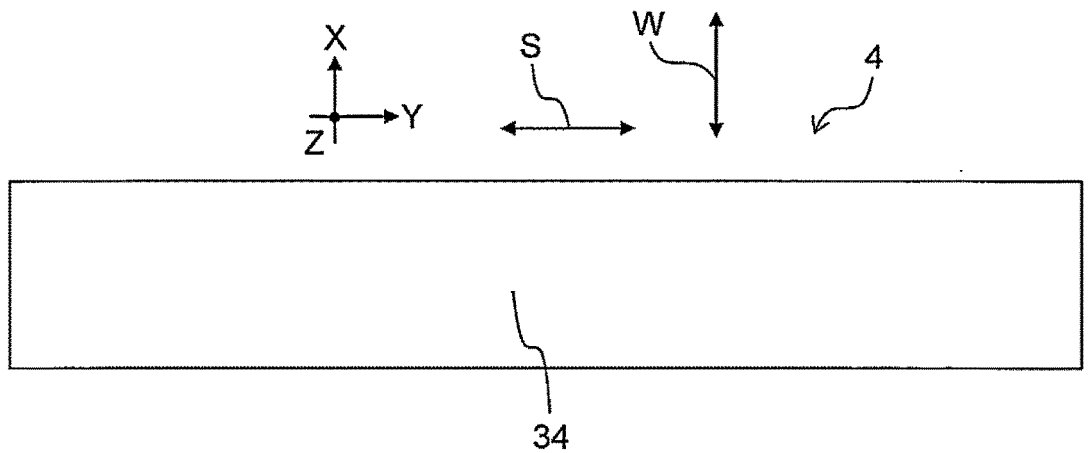
FIG. 5 is a top view of a third layer of the multilayer resin substrate according to Preferred Embodiment 1 of the present invention.

FIG. 1 is a longitudinal sectional view of a multilayer resin substrate 100. FIG. 2 is a partial enlarged view of FIG. 1. FIGS. 3 to 5 are top views of individual layers of a second substrate 4 of the multilayer resin substrate 100. FIG. 3 is a top view of a first layer taken along a line I-I in FIG. 2. FIG. 4 is a top view of a second layer taken along a line II-II in FIG. 2. FIG. 5 is a top view of a third layer taken along a line III-III in FIG. 2.

The multilayer resin substrate 100 illustrated in FIG. 1 is a substrate to transmit a signal such as a radio-frequency signal, for example. The multilayer resin substrate 100 is used for an electronic component inside an electronic apparatus such as a smartphone, for example. Exemplary applications of the multilayer resin substrate 100 include, for example, antennas, and transmission lines for electrically connecting two circuits to each other.

As illustrated in FIG. 1, the multilayer resin substrate 100 includes a first substrate 2 and the second substrate 4.

Each of the first substrate 2 and the second substrate 4 is a dielectric substrate. The first substrate 2 and the second substrate 4 are joined to each other in an overlapping manner in a thickness direction T. In an example illustrated in FIG.

1, the first substrate 2 is located at an upper position, and the second substrate 4 is located at a lower position. A lower surface of the first substrate 2, and an upper surface of the second substrate 4 are joined to each other to define a joint surface.

The first substrate 2 and the second substrate 4 have different outer shapes when viewed in the thickness direction T. In the example illustrated in FIG. 1, the second substrate 4 has a larger outer shape than the first substrate 2 when viewed in the thickness direction T. A region where the first substrate 2 and the second substrate 4 overlap each other is a rigid region A. A region where the first substrate 2 and the second substrate 4 do not overlap each other and only one of the second substrate 4 and the first substrate 2 exists is a flexible region B. The multilayer resin substrate 100 including the flexible region B with high flexibility defines as a flexible substrate.

The first substrate 2 includes a dielectric 6, multiple signal electrodes 8 (hereinafter also referred to in the singular as "signal electrode 8" for convenience, as with other elements described herein), multiple via-conductors 10, and multiple ground electrodes 12.

The dielectric 6 is made of a resin that is an insulator material. The dielectric 6 supports multiple electrodes/conductors. The signal electrode 8 supported by the dielectric 6 is an electrode to transmit a signal such as a radio-frequency signal, for example. Multiple signal electrodes 8 are spaced apart from each other in the thickness direction T. The via-conductor 10 is a conductor to connect multiple signal electrodes 8 to each other. The via-conductor 10 extends in the thickness direction T. The ground electrode 12 is an electrode connected to a reference/ground potential. The example illustrated in FIG. 1 shows only the ground electrodes 12 disposed on the upper surface of the first substrate 2. The ground electrode 12 may be connected to a reference/ground potential by any suitable method, such as frame grounding to the chassis of an electronic apparatus, for example. The same applies to other ground electrodes.

The dielectric 6 is made of, for example, a ceramic material, or a thermoplastic resin such as liquid crystal polymer (LCP), polytetrafluoroethylene (PTFE), polyimide (PI), or modified polyimide (MPI). The signal electrode 8 and the ground electrode 12 are each made of, for example, a metal foil such as a copper foil. The via-conductor 10 is made of, for example, a metal such as copper.

The exemplary arrangement of electrodes/conductors for the first substrate 2 in FIG. 1 is illustrative, and any other arrangement that allows electrical connection to the second substrate 4 to enable transmission of a signal such as a radio-frequency signal may be provided or included.

Although not illustrated, the surface of the first substrate 2 or the second substrate 4 may be provided with a protective film such as a resist, for example.

The second substrate 4 includes a dielectric 16, multiple signal electrodes 18, 20, and 22, multiple via-conductors 24, 26, and 28, multiple ground electrodes 30, 32, and 34, and multiple floating electrodes 40 and 42.

The dielectric 16 is made of a resin that is an insulator material. The dielectric 16 supports multiple electrodes/conductors. Each of the signal electrodes 18, 20, and 22 supported by the dielectric 16 is an electrode to transmit a signal such as a radio-frequency signal, for example. In the example illustrated in FIG. 1, the signal electrodes 18 and 22 are provided on a first layer of the second substrate 4, and the signal electrode 20 is provided on a second layer of the second substrate 4. The signal electrode 18 is connected to the signal electrode 8 of the first substrate 2 via the via-conductor 10. The via-conductors 24, 26, and 28 are conductors to connect signal electrodes or ground electrodes to each other, and extend in the thickness direction T. The via-conductor 24 connects the signal electrodes 18 and 20 to each other. The via-conductor 26 connects the signal electrodes 20 and 22 to each other. The via-conductor 28 connects the ground electrodes 30 and 32 to each other. Each of the ground electrodes 30, 32, and 34 is an electrode connected to a reference/ground potential, and provided on the corresponding one of the layers of the second substrate 4. The ground electrode 30 is provided on the first layer of the second substrate 4. The ground electrode 32 is provided on the second layer of the second substrate 4. The ground electrode 34 is provided on a third layer of the second substrate 4.

The dielectric 16 is made of, for example, a thermoplastic resin such as LCP, PTFE, PI, or MPI. The signal electrodes 18, 20, and 22, and the ground electrodes 30, 32, and 34 are each made of, for example, a metal foil such as a copper foil. The via-conductors 24, 26, and 28 are each made of, for example, a metal such as copper.

The signal electrode 18 and the ground electrode 30 of the second substrate 4 are provided on the joint surface between the first substrate 2 and the second substrate 4.

The signal electrodes 18, 20, and 22 each transmit a signal in a signal transmission direction S perpendicular or substantially perpendicular to the thickness direction T. Hereinafter, a direction corresponding to the thickness direction T is referred to as Z-direction, a direction corresponding to the signal transmission direction S is referred to as Y-direction, and a direction (a line-width direction W described later) perpendicular or substantially perpendicular to the thickness direction T and to the signal transmission direction S is referred to as X-direction.

The floating electrodes 40 and 42 are electrodes not connected to a specific potential. The floating electrodes 40 and 42 are not connected to other electrodes/conductors, and are maintained at a floating potential.

In the example illustrated in FIG. 1, the floating electrodes 40 and 42 are provided on the second layer of the second substrate 4, and located between the signal electrode 20 and the ground electrode 32, which are provided on the same layer. As used herein, the term "same layer" means being the same or overlapping position in the thickness direction T.

In the thickness direction T, the floating electrode 40 is disposed between the signal electrode 18, which is provided on the first layer, and the ground electrode 34, which is provided on the third layer. In the thickness direction T, the floating electrode 42 is disposed between the signal electrode 22, which is provided on the first layer, and the ground electrode 34, which is provided on the third layer.

Providing the floating electrodes 40 and 42 on the second layer helps to reduce the occurrence of localized depressions on the second substrate 4, and consequently improve the flatness of the second substrate 4, in comparison to not providing the floating electrodes 40 and 42 on the second layer. The configuration described above also helps to reduce an increase in stray capacitance between each of the signal electrodes 18 and 22, and the ground electrode 32, in comparison to extending the ground electrode 32 on the second layer in the Y-direction instead of providing the floating electrodes 40 and 42.

As illustrated in FIG. 3, the first layer of the second substrate 4 is provided with the ground electrode 30. Openings are provided near both end portions of the ground electrode 30 in the Y-direction. The signal electrode 18 or 22 is exposed through each of the openings. In the exemplary configuration illustrated in FIG. 3, three openings are spaced apart from each other in the X-direction near each end portion of the ground electrode 30 in the Y-direction.

As illustrated in FIG. 4, the second layer of the second substrate 4 is provided with the ground electrode 32. The ground electrode 32 includes openings. The signal electrode 20, and the floating electrode 40 or 42 are exposed through each of the openings. In the exemplary configuration illustrated in FIG. 4, three openings are located inside of the ground electrode 32, and provided with a spacing from each other in the X-direction.

Through the three openings provided in the ground electrode 32, three signal electrodes 20, three floating electrodes 40, and three floating electrodes 42 overlap the three openings as seen from the thickness direction.

According to the first preferred embodiment, the three signal electrodes 20 have the same or substantially the same length in the signal transmission direction S. For each of the three signal electrodes 20, the floating electrodes 40 and 42 are disposed within the same opening in which the signal electrode 20 is disposed.

The floating electrode 40 is located outside of an end portion (right end portion) of the signal electrode 20 where the signal electrode 20 connects to the via-conductor 24. The floating electrode 42 is located outside of an end portion (left end portion) of the signal electrode 20 where the signal electrode 20 connects to the via-conductor 26.

The arrangements illustrated in FIGS. 3 and 4 are not to be construed restrictively. Any number of the signal electrodes 20 may be provided. Further, there may be any number of the signal electrodes 20 for which the floating electrodes 40 and 42 are provided within the same opening. For some signal electrodes 20, no floating electrodes 40 and 42 may be provided within the same opening.

FIGS. 3 and 4 do not show the via-conductor 28 (FIGS. 1 and 2), which connects the ground electrode 30 on the first layer and the ground electrode 32 on the second layer to each other. One or more via-conductors 28 may be provided at any suitable location.

As illustrated in FIG. 5, the third layer of the second substrate 4 is provided with the ground electrode 34. In the example illustrated in FIG. 5, the entire or substantially the entire surface of the third layer of the second substrate 4 is provided with the ground electrode 34. When viewed in the thickness direction T, the ground electrode 34 overlaps all of the signal electrodes of the second substrate 4, all of the via-conductors of the second substrate 4, and the other ground electrodes of the second substrate 4.

As illustrated in FIG. 3, when viewed in the thickness direction T, the signal electrode 18, which is provided on the first layer, overlaps the floating electrode 40 (represented by dotted lines), which is provided on the second layer. Locating the floating electrode 40 directly under the signal electrode 18 makes it easier to improve the flatness of the second substrate 4, and reduce and increase in stray capacitance between the signal electrode 18 and the ground electrode 32.

Figure 6:
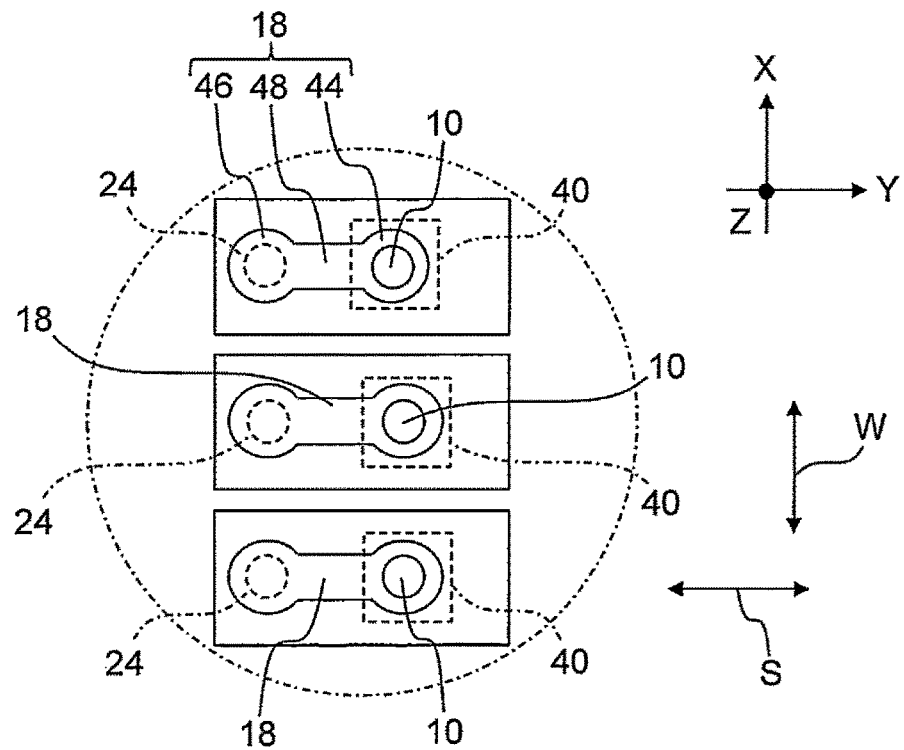
FIG. 6 is a partial enlarged view of FIG. 3.

FIG. 6 is a partial enlarged view of FIG. 3. FIG. 6 illustrates how the signal electrode 18 and the floating electrode 40 overlap each other when viewed in the thickness direction T.

As illustrated in FIG. 6, the signal electrode 18 includes joints 44 and 46, and a wiring portion 48. The joints 44 and 46 are portions to respectively join the via-conductors 10 and 24 to the signal electrode 18. Each of the joints 44 and 46 is also referred to as "via-receiving portion." The joint 44 is joined to the via-conductor 10 located above the joint 44. The joint 46 is joined to the via-conductor 24 located below the joint 46. The wiring portion 48 interconnects the two joints 44 and 46. The wiring portion 48 extends in the signal transmission direction S to transmit a signal in the signal transmission direction S.

The joints 44 and 46, and the wiring portion 48 may be distinguished from each other as follows. In the signal transmission direction S, regions each extending from the distal end of the signal electrode 18 by a length corresponding to the maximum width (the maximum width of the signal electrode 18 in the line-width direction W, that is, the diameter of each of the joints 44 and 46) are defined as the joints 44 and 46, and the region other than the above-described regions is defined as the wiring portion 48.

The joints 44 and 46 each have a length (i.e., "line width") in the line-width direction W perpendicular or substantially perpendicular to the signal transmission direction S that differs from the length of the wiring portion 48. Specifically, the joints 44 and 46 each have a line width (diameter) greater than the line width of the wiring portion 48. The line width in this case refers to the maximum line width. As described above, the joints 44 and 46, which define and function as via-receiving portions, are enlarged by making the joints 44 and 46 have a relatively large line width. This makes it easier to structure the via-conductors 10 and 24 with a size that allows the via-conductors 10 and 24 to withstand stress concentration that occurs when the flexible region B of the multilayer resin substrate 100 undergoes bending. This in turn leads to improved joint strength.

The joints 44 and 46 have a line width (diameter) of, for example, about 400 μm. The respective portions of the via-conductors 10 and 26 joined to the joints 44 and 46 have a line width (diameter) of, for example, about 150 μm. For example, making the joints 44 and 46 have a line width greater than or equal to twice the line width of the via-conductors 10 and 24 makes it possible to effectively increase joint strength. This allows the first substrate 2 and the second substrate 4 to be joined to each other even in the presence of slight displacement in their relative joint positions. The wiring portion 48 has a line width of, for example, about 30 μm to about 300 μm.

A case is now considered where, in enlarging the joints 44 and 46, a ground electrode located opposite to the joints 44 and 46 in the thickness direction T is provided. In this case, the stray capacitance between each of the joints 44 and 46 and the ground electrode tends to increase, which tends to result in reduced impedance of the wiring conductors of the second substrate 4.

By contrast, if the floating electrode 40 is positioned to overlap the joint 44 of the signal electrode 18 when viewed in the thickness direction T as illustrated in FIG. 6, such a configuration helps to prevent the ground electrode 32 on the second layer from extending into the space directly under the joint 44. This makes it possible to reduce an increase in stray capacitance between the signal electrode 18 and the ground electrode 32 while maintaining the flatness of the second substrate 4 by the floating electrode 40.

In the example illustrated in FIG. 6, the floating electrode 40 has a rectangular or substantially rectangular shape when viewed in the thickness direction T. The floating electrode 40 is dimensioned to be larger than the joint 44 of the signal electrode 18. In the signal transmission direction S, the floating electrode 40 is longer than the joint 44. In the line-width direction W, the floating electrode 40 is longer than the joint 44. When viewed in the thickness direction T, the floating electrode 40 overlaps the entire joint 44.

As described above, the floating electrode 40 overlaps the entire or substantially the entire joint 44 by being dimensioned to be larger than the joint 44. This makes it possible to further improve the flatness of the second substrate 4, and further reduce an increase in stray capacitance.

Figure 7:
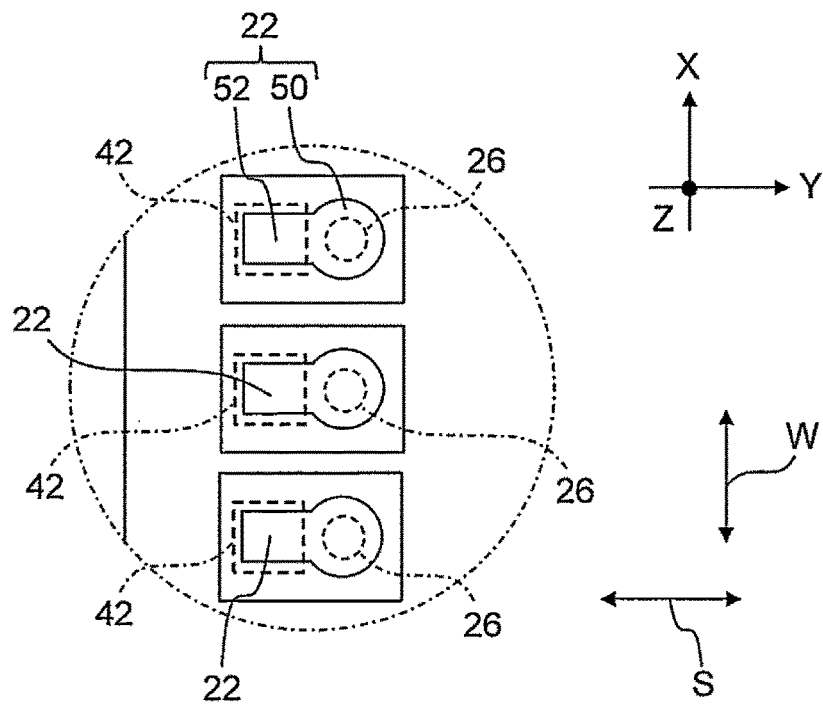
FIG. 7 is a partial enlarged view of FIG. 3.

FIG. 7 is a partial enlarged view of FIG. 3. FIG. 7 illustrates how the signal electrode 22 (first layer) and the floating electrode 42 overlap (second layer) each other when viewed in the thickness direction T.

As illustrated in FIG. 7, the signal electrode 22 includes a joint 50, and a wiring portion 52. The joint 50 is a via-receiving portion that is joined to the via-conductor 26 located below the joint 50. The wiring portion 52 extends in the signal transmission direction S from the joint 50. With respect to the line-width direction W, the joint 50 has a line width (diameter) greater than the line width of the wiring portion 52. The joint 50 may have a line width equal or substantially equal to the line width of the joints 44 and 46 illustrated in FIG. 6. The wiring portion 52 may have a line width equal or substantially equal to the line width of the wiring portion 48 illustrated in FIG. 6. The wiring portion 52 may have a line width greater than the line width of the signal electrode 20 to allow mounting of a connector, a chip component, or other components. In that case, the presence of the floating electrode 42 helps to reduce an increase in stray capacitance at the location of the wiring portion 52 more effectively.

As illustrated in FIG. 7, when viewed in the thickness direction T, the floating electrode 42 is positioned to overlap the wiring portion 52 of the signal electrode 22. Providing the floating electrode 42 directly under the wiring portion 52 of the signal electrode 22 makes it possible to reduce an increase stray capacitance between the signal electrode 22 and the ground electrode 32 while maintaining the flatness of the second substrate 4 by the floating electrode 42.

Although the joint 44 illustrated in FIG. 6 that is located opposite to the floating electrode 40 has a relatively large line width, the wiring portion 52 illustrated in FIG. 7 that is located opposite to the floating electrode 42 has a relatively small line width. If the region where the floating electrode 40 and the joint 44 overlap each other is larger than the region where the floating electrode 42 and the wiring portion 52 overlap each other, then the floating electrode 40 provides a greater reduction of an increase in stray capacitance than does the floating electrode 42.

Referring back to FIG. 2, with regard to the distance in the signal transmission direction S on the second layer of the second substrate 4, the floating electrode 40 and the signal electrode 20 have a distance D1 between each other that is greater than a distance D2 between the floating electrode 40 and the ground electrode 32. Adjusting the distances D1 and D2 makes it possible to adjust the impedance of the wiring conductors of the second substrate 4.

According to Preferred Embodiment 1, the distance D1>the distance D2. Making the distance D1 relatively large helps to ensure that a sufficient gap is present between the floating electrode 40 and the signal electrode 20. As a result, in manufacturing the multilayer resin substrate 100, a resin in liquid form (e.g., thermoplastic resin), which is the material of the dielectric 16, can be easily poured into the gap between the floating electrode 40 and the signal electrode 20. The above-described configuration allows for increased shape stability of the second substrate 4, and also improved flatness of the second substrate 4. In particular, the ability to facilitate pouring of the resin into the space directly under the joint 44, which is a via-receiving portion, helps to reduce potential protrusion of the via-conductor 24 from the second substrate 4, and consequently improve the flatness of the second substrate 4. That is, the above-described configuration helps to reduce sticking-up of the via-conductor 24 from the second substrate 4. This helps to reduce potential protrusion of the signal electrode 18, and consequently reduce deterioration of the flatness of the second substrate 4.

The floating electrode 40 has a length L1 in the signal transmission direction S. According to the first preferred embodiment, the length L1 of the floating electrode 40 is greater than a distance D3 between the via-conductors 10 and 24. Increasing the floating electrode 40 in size as described above allows for greater improvement in flatness and greater reduction of stray capacitance.

In the multilayer resin substrate 100 configured as described above, the dielectric 6 of the first substrate 2 has a relative permittivity higher than the relative permittivity of the dielectric 16 of the second substrate 4. The comparatively high relative permittivity of the dielectric 6 facilitates miniaturization of the first substrate 2.

Exemplary materials/substrates with high relative permittivity include ceramic materials, glass epoxy substrates, and low temperature co-fired ceramics (LTCC) substrates. Exemplary materials/substrates with low relative permittivity include LCP resins, PTFE resins, PI resins, and MPI resins. Using multiple such materials in combination with each other or alone allows the dielectrics 6 and 16 to differ in relative permittivity. Exemplary methods for measuring relative permittivity include resonator methods and free-space methods. The respective relative permittivities of the dielectrics 6 and 16 may be compared based on measurements obtained by such a measurement method.

The multilayer resin substrate 100 configured as described above defines and functions as an electronic component within an electronic apparatus to transmit a signal such as a radio-frequency signal, for example. According to Preferred Embodiment 1, the first substrate 2 is an antenna element, and the second substrate 4 is a transmission line. This allows the multilayer resin substrate 100 to define and function as an antenna. According to Preferred Embodiment 1, in particular, the dielectric 6 of the first substrate 2 has a relative permittivity higher than the relative permittivity of the dielectric 16 of the second substrate 4. This allows for reduction of antenna size.

As illustrated in FIGS. 1 and 4, on the second layer of the second substrate 4, the floating electrodes 40 and 42 are each positioned to fill in the gap between the signal electrode 20 and the ground electrode 32. This makes it possible to reduce an increase in stray capacitance between each of the signal electrodes 18 and 22, and the ground electrode 32 while maintaining the flatness of the second substrate 4.

Further, as illustrated in FIGS. 2 and 6, the floating electrode 40 is disposed directly under the joint 44, which is a portion of the signal electrode 18 that has a relatively large line width. This makes it possible to reduce an increase in stray capacitance between the signal electrode 18 and the ground electrode 32 more effectively.

Advantageous Effects

The multilayer resin substrate 100 according to Preferred Embodiment 1 includes the first substrate 2, the second substrate 4, the signal electrode 18 (first signal electrode), the via-conductor 10 (first via-conductor), the ground electrode 34 (first ground electrode), and the floating electrode 40 (first floating electrode). The first substrate 2 and the second substrate 4 are joined to each other in an overlapping manner in the thickness direction T. The signal electrode 18 is provided on the joint surface between the first substrate 2 and the second substrate 4. The via-conductor 10 is provided in the first substrate 2, and joined to the signal electrode 18. The ground electrode 34 is provided in or on the second substrate 4, and overlaps the signal electrode 18 when viewed in the thickness direction T. The floating electrode 40 is provided in the second substrate 4, and located between the signal electrode 18 and the ground electrode 34 the thickness direction T. The signal electrode 18 includes the joint 44 (first joint), and the wiring portion 48. The joint 44 is joined to the via-conductor 10. The wiring portion 48 extends in the signal transmission direction S. In the line-width direction W transverse to the signal transmission direction S, the joint 44 has a line width greater than a line width of the wiring portion 48. When viewed in the thickness direction T, the floating electrode 40 overlaps the joint 44 of the signal electrode 18.

According to the configuration described above, the floating electrode 40 is located between the joint 44 of the signal electrode 18, and the ground electrode 34. In comparison to a case where no floating electrode 40 is provided, this configuration makes it possible to improve the flatness of the second substrate 4, and also reduce generation of capacitance between the signal electrode 18 (in particular, the joint 44) and another electrode.

The multilayer resin substrate 100 according to Preferred Embodiment 1 further includes the ground electrode 32 (second ground electrode) provided on the same layer of the second substrate 4 as the floating electrode 40 (first floating electrode) According to the configuration described above, the floating electrode 40 is provided on the same layer as the ground electrode 32. This helps to prevent the ground electrode 32 from extending into the space directly under the joint 44 of the signal electrode 18, and consequently reduce generation of capacitance between the signal electrode 18 and the ground electrode 32.

In the multilayer resin substrate 100 according to Preferred Embodiment 1, the signal electrode 18 (first signal electrode) includes the joint 46 (second joint) different from the joint 44 (first joint). The multilayer resin substrate 100 further includes the via-conductor 24 (second via-conductor), and the signal electrode 20 (second signal electrode). The via-conductor 24 is provided in the second substrate, and joined to the joint 46. The signal electrode 20 is provided on the same layer of the second substrate 4 as the floating electrode 40 (first floating electrode), and joined to the via-conductor 24. According to the configuration described above, the floating electrode 40 is provided on the same layer as the signal electrode 20. This helps to reduce the occurrence of localized depressions on the second substrate 4, and consequently improve the flatness of the second substrate 4.

The multilayer resin substrate 100 according to Preferred Embodiment 1 further includes the ground electrode 32 (second ground electrode) provided on the same layer of the second substrate 4 as the floating electrode 40 (first floating electrode) and the signal electrode 20 (second signal electrode). The floating electrode 40 and the signal electrode 20 have the distance D1 between each other that is greater than the distance D2 between the floating electrode 40 and the ground electrode 32. According to the configuration described above, providing the distance D1 between the floating electrode 40 and the signal electrode 20 makes it easier to pour resin into the space between the floating electrode 40 and the signal electrode 20.

In the multilayer resin substrate 100 according to Preferred Embodiment 1, in the line-width direction W, the floating electrode 40 (first floating electrode) is longer than the joint 44 (first joint). According to the configuration described above, the floating electrode 40 is larger than the joint 44. This makes it easier to improve flatness and reduce generation of capacitance more effectively.

In the multilayer resin substrate 100 according to Preferred Embodiment 1, in the signal transmission direction S, the floating electrode 40 (first floating electrode) is longer than the joint 44 (first joint). According to the configuration described above, the floating electrode 40 is larger than the joint 44. This makes it easier to improve flatness and reduce generation of capacitance more effectively.

In the multilayer resin substrate 100 according to Preferred Embodiment 1, in the signal transmission direction S, the floating electrode 40 (first floating electrode) has the length L1 greater than the distance D3 between the via-conductor 10 (first via-conductor) and the via-conductor 24 (second via-conductor). According to the configuration described above, the floating electrode 40 is larger than the joint 44. This makes it easier to improve flatness and reduce generation of capacitance more effectively.

In the multilayer resin substrate 100 according to Preferred Embodiment 1, when viewed in the thickness direction T, the floating electrode 40 (first floating electrode) overlaps the entire or substantially the entire joint 44 (first joint). According to the configuration described above, the floating electrode 40 is larger than the joint 44. This makes it easier to improve flatness and reduce generation of capacitance more effectively.

In the multilayer resin substrate 100 according to Preferred Embodiment 1, the first substrate 2 is made of the dielectric 6 with a relative permittivity higher than a relative permittivity of the dielectric 16 of the second substrate 4. The configuration described above facilitates miniaturization of the first substrate 2. If the first substrate 2 is an antenna element, for example, the configuration described above allows for a reduction of antenna size.

In the multilayer resin substrate 100 according to Preferred Embodiment 1, the first substrate 2 is an antenna element. The configuration described above allows the multilayer resin substrate 100 to define and function as an antenna.

In the multilayer resin substrate 100 according to Preferred Embodiment 1, the ground electrode 34 (first ground electrode) is connected to a ground potential. The configuration described above enables functioning as the ground electrode 34.

In the multilayer resin substrate 100 according to Preferred Embodiment 1, the floating electrode 40 (first floating electrode) is not connected to a specific potential. The configuration described above enables functioning as the floating electrode 40.

The electronic component according to Preferred Embodiment 1 includes the multilayer resin substrate 100. According to the configuration described above, advantageous effects the same as or similar to those of the multilayer resin substrate 100 can be provided.

Preferred Embodiment 2

Figure 8:
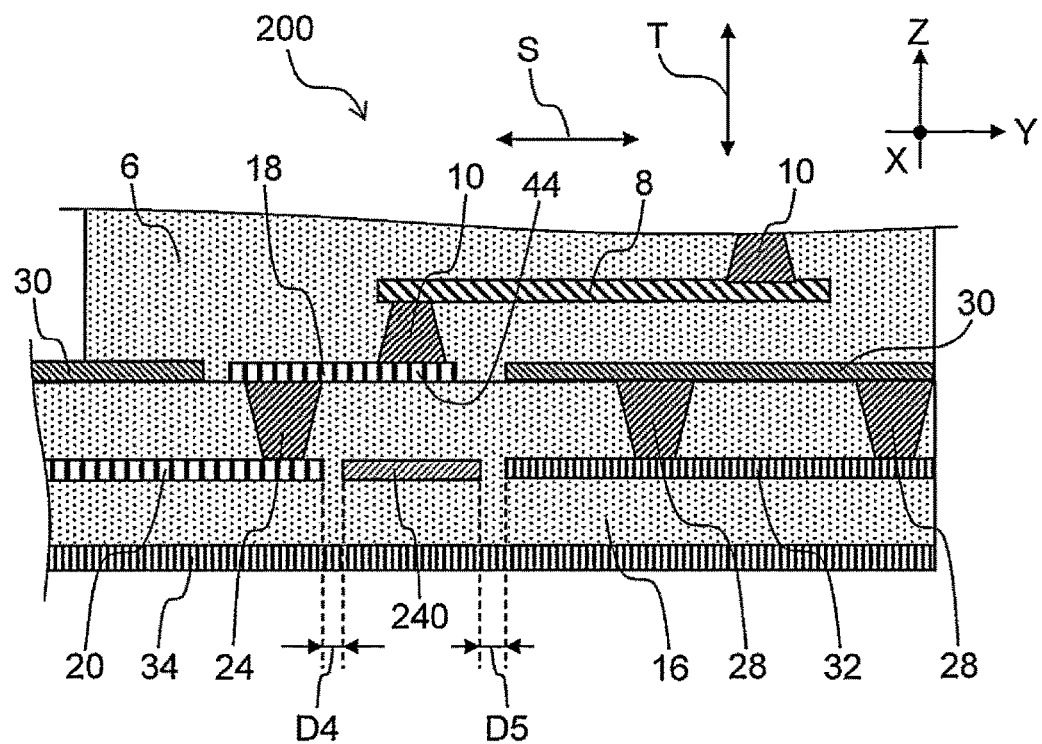
FIG. 8 is an enlarged longitudinal sectional view of a portion of a multilayer resin substrate according to Preferred Embodiment 2 of the present invention.

Reference is now made to FIG. 8 to describe how the multilayer resin substrate 100 according to Preferred Embodiment 1 and a multilayer resin substrate 200 according to Preferred Embodiment 2 of the present invention differ from each other. In the following description, features the same as or similar to those of Preferred Embodiment 1 are denoted by the same names or the same reference signs. Features overlapping those of Preferred Embodiment 1 are not described in further detail.

FIG. 8 is an enlarged longitudinal sectional view of a portion of the multilayer resin substrate 200 according to Preferred Embodiment 2.

Preferred Embodiment 2 differs from Preferred Embodiment 1 in that a floating electrode 240 and the signal electrode 20 have a distance D4 between each other that is greater a distance D5 between the floating electrode 240 and the ground electrode 32.

As illustrated in FIG. 8, the multilayer resin substrate 200 includes the floating electrode 240 instead of the floating electrode 40. The floating electrode 240 is provided on the second layer, that is, on the same layer as the signal electrode 20 and the ground electrode 32. The floating electrode 240 is located directly under the joint 44 of the signal electrode 18 provided on the first layer.

According to Preferred Embodiment 2, in the signal transmission direction S, the distance D4 between the floating electrode 240 and the signal electrode 20 is greater than the distance D5 between the floating electrode 240 and the ground electrode 32. As described above, the distance D5 between the floating electrode 240 and the ground electrode 32 is relatively large. This makes it possible to reduce an increase in the stray capacitance generated between the signal electrode 18 and the ground electrode 32 via the floating electrode 240.

As described above, the multilayer resin substrate 200 according to Preferred Embodiment 2 further includes the ground electrode 32 (second ground electrode) provided on the same layer of the second substrate 4 as the floating electrode 240 (first floating electrode) and the signal electrode 20 (second signal electrode). The floating electrode 240 and the ground electrode 32 have the distance D5 between each other that is greater than the distance D4 between the floating electrode 240 and the signal electrode 20.

According to the configuration described above, the distance D5 is relatively large. This helps to reduce an increase in stray capacitance generated between the signal electrode 18 and the ground electrode 32 via the floating electrode 240, and consequently to increase impedance of the wiring conductors of the second substrate 4.

According to Preferred Embodiment 2, the following relationship is satisfied: the distance D4<the distance D5. This results in increased impedance. In contrast, according to Preferred Embodiment 1, the following relationship is satisfied: the distance D1<the distance D2. This results in increased capacitance generated between the signal electrode 18 and the ground electrode 32 via the floating electrode 40, and consequently in relatively decreased impedance. The configuration described above can be exploited such that, by choosing either one of the relationship that the distance D1>the distance D2, and the relationship that the distance D4<the distance D5, the impedance of the wiring conductors of the second substrate 4 can be increased or decreased to thus adjust the impedance to a desired value.

Preferred Embodiment 3

Figure 9:
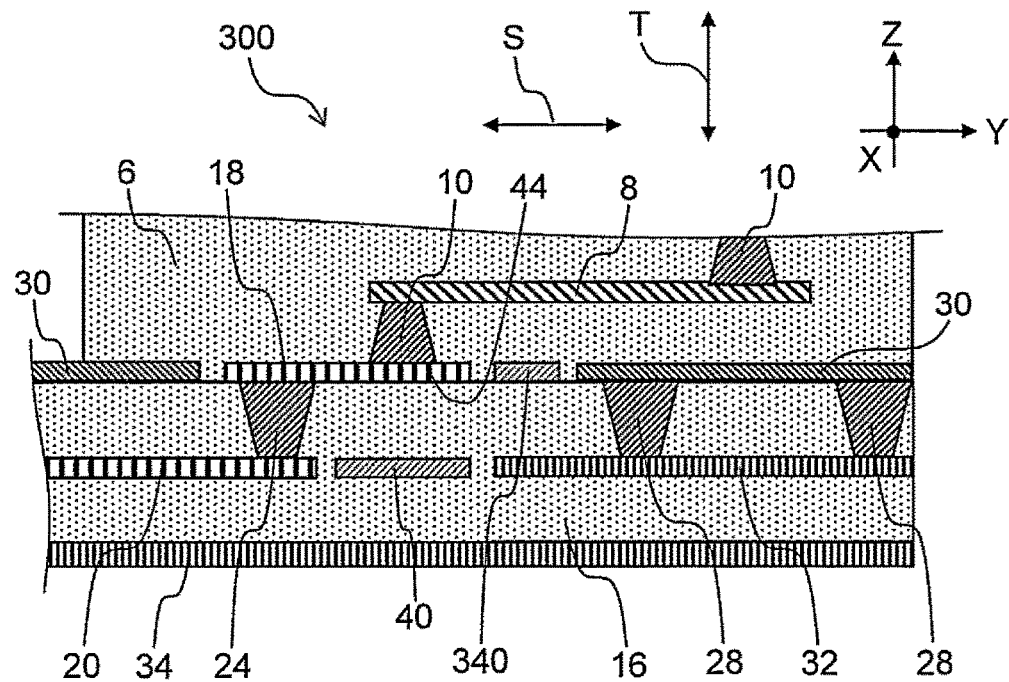
FIG. 9 is an enlarged longitudinal sectional view of a portion of a multilayer resin substrate according to Preferred Embodiment 3 of the present invention.

Reference is now made to FIG. 9 to describe how the multilayer resin substrate 100 according to Preferred Embodiment 1 and a multilayer resin substrate 300 according to Preferred Embodiment 3 of the present invention differ from each other. In the following description, features the same as or similar to those of Preferred Embodiment 1 are denoted by the same names or the same reference signs. Features overlapping those of Preferred Embodiment 1 are not described in further detail.

FIG. 9 is an enlarged longitudinal sectional view of a portion of the multilayer resin substrate 300 according to Preferred Embodiment 3.

Preferred Embodiment 3 differs from Preferred Embodiment 1 in that a floating electrode 340 different from the floating electrodes 40 and 42 is further provided.

As illustrated in FIG. 9, the multilayer resin substrate 300 includes the floating electrode 340. Unlike the floating electrodes 40 and 42, the floating electrode 340 is provided on the first layer of the second substrate 4, and located between the signal electrode 18 and the ground electrode 30, which are provided on the same first layer. When viewed in the thickness direction T, the floating electrode 340 overlaps the ground electrode 32 provided on the second layer, the ground electrode 34 provided on the third layer, and also the signal electrode 8 of the first substrate 2.

Positioning the floating electrode 340 as described above allows the floating electrode 340 to fill in the gap between the signal electrode 18 and the ground electrode 30 to thus reduce the occurrence of localized depressions and improve the flatness of the multilayer resin substrate 300. Further, the signal electrode 18 and the ground electrode 30 can be spaced apart from each other. This helps to reduce an increase in capacitance between the signal electrode 18 and the ground electrode 30, and consequently to decrease impedance.

As described above, the multilayer resin substrate 300 according to Preferred Embodiment 3 further includes the floating electrode 340 (second floating electrode) provided on the same layer as the signal electrode 18 (first signal electrode), and positioned to overlap the ground electrode 32 (second ground electrode) when viewed in the thickness direction T.

The configuration described above makes it possible to improve the flatness of the multilayer resin substrate 300, and also reduce the generation of capacitance between the signal electrode 18 and the ground electrode 32, in comparison to a case where no floating electrode 340 is provided.

The multilayer resin substrate 300 according to Preferred Embodiment 3 further includes the ground electrode 30 (third ground electrode) provided on the same layer as the signal electrode 18 (first signal electrode) and the floating electrode 340 (second floating electrode), and positioned to overlap the ground electrode 32 (second ground electrode) when viewed in the thickness direction T. According to the configuration described above, due to the presence of the ground electrode 30, the distance between the signal electrode 8 and the ground electrode can be changed. This allows for impedance adjustment.

Although the present disclosure has been described above by way of Preferred Embodiments 1, 2, and 3, the present disclosure is not limited to Preferred Embodiments 1, 2, and 3 described above. For example, although the foregoing description of Preferred Embodiment 1 is directed to a case where the first substrate 2 is an antenna element and the multilayer resin substrate 300 defines and functions as an antenna of an electronic apparatus, this is not to be construed restrictively. Rather than being an antenna element, the first substrate 2 may be a transmission line used for other applications. For example, the first substrate 2 may be a transmission line such that the signal electrode 8 of the first substrate 2 is joined to a first circuit (not illustrated) of an electronic component, and the signal electrode 22 of the second substrate 4 is joined to a second circuit (not illustrated) of the electronic component, with a radio-frequency signal being transmitted between the two circuits via the signal electrodes 8, 18, 20, and 22.

Although the foregoing description of Preferred Embodiments 1, 2, and 3 is directed to a case where the ground electrodes 30, 32, and 34 are provided, this is not to be construed restrictively. For example, in one alternative configuration, ground electrodes such as the ground electrode 30 on the first layer or the ground electrode 32 on the second layer are not provided.

Although the present disclosure has been described in sufficient detail by way of its preferred embodiments with reference to the accompanying drawings, various modifications and alterations will be apparent to those skilled in the art. Such modifications and alterations are to be understood as falling within the scope of the present disclosure as defined by the appended claims without departing therefrom. Any changes in the combination or sequential order of elements in the preferred embodiments can be accomplished without departing from the scope and spirit of the present disclosure.

Of the various preferred embodiments and the various modifications described above, any preferred embodiments and any modifications may be used in combination to provide the advantageous effects of such individual preferred embodiments and such individual modifications.

Preferred embodiments of the present invention are applicable to any multilayer resin substrate including a first substrate and a second substrate, and to any electronic component including the multilayer resin substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer resin substrate comprising:
   a first substrate and a second substrate joined to each other in an overlapping manner in a thickness direction;
   a first signal electrode on a joint surface between the first substrate and the second substrate;
   a first via-conductor in the first substrate, and joined to the first signal electrode;
   a first ground electrode in or on the second substrate, the first ground electrode overlapping the first signal electrode when viewed in the thickness direction; and
   a first floating electrode in the second substrate, the first floating electrode being located between the first signal electrode and the first ground electrode in the thickness direction; wherein
   the first signal electrode includes:
      a first joint joined to the first via-conductor; and
      a wiring portion extending in a signal transmission direction;
   in a line-width direction transverse to the signal transmission direction, the first joint has a line width greater than a line width of the wiring portion; and
   when viewed in the thickness direction, the first floating electrode overlaps the first joint of the first signal electrode.

2. The multilayer resin substrate according to claim 1, further comprising a second ground electrode on a same layer of the second substrate as the first floating electrode.

3. The multilayer resin substrate according to claim 2, further comprising a second floating electrode on a same layer as the first signal electrode, and overlapping the second ground electrode when viewed in the thickness direction.

4. The multilayer resin substrate according to claim 3, further comprising a third ground electrode on a same layer as the first signal electrode and the second floating electrode, and overlapping the second ground electrode when viewed in the thickness direction.

5. The multilayer resin substrate according to claim 1, wherein
   the first signal electrode includes a second joint different from the first joint; and
   the multilayer resin substrate further includes:
      a second via-conductor in the second substrate and joined to the second joint; and
      a second signal electrode on a same layer of the second substrate as the first floating electrode, the second signal electrode being joined to the second via-conductor.

6. The multilayer resin substrate according to claim 5, further comprising:
   a second ground electrode on a same layer of the second substrate as the first floating electrode and the second signal electrode; wherein
   the first floating electrode and the second signal electrode are spaced from each other by a distance that is greater than a distance between the first floating electrode and the second ground electrode.

7. The multilayer resin substrate according to claim 5, further comprising:
   a second ground electrode on a same layer of the second substrate as the first floating electrode and the second signal electrode; wherein
   the first floating electrode and the second ground electrode are spaced from each other by a distance that is greater than a distance between the first floating electrode and the second signal electrode.

8. The multilayer resin substrate according to claim 5, wherein in the signal transmission direction, the first floating electrode has a length greater than a distance between the first via-conductor and the second via-conductor.

9. The multilayer resin substrate according to claim 1, wherein in the line-width direction, the first floating electrode is longer than the first joint.

10. The multilayer resin substrate according to claim 1, wherein in the signal transmission direction, the first floating electrode is longer than the first joint.

11. The multilayer resin substrate according to claim 1, wherein, when viewed in the thickness direction, the first floating electrode overlaps an entirety or substantially an entirety of the first joint.

12. The multilayer resin substrate according to claim 1, wherein the first substrate is made of a dielectric with a relative permittivity higher than a relative permittivity of a dielectric of the second substrate.

13. The multilayer resin substrate according to claim 1, wherein the first substrate includes an antenna.

14. The multilayer resin substrate according to claim 1, wherein the first ground electrode is connected to a ground potential.

15. The multilayer resin substrate according to claim 1, wherein the first floating electrode is not connected to a specific potential.

16. An electronic component comprising the multilayer resin substrate according to claim 1.

17. The electronic component according to claim 16, further comprising a second ground electrode on a same layer of the second substrate as the first floating electrode.

18. The electronic component according to claim 16, wherein
- the first signal electrode includes a second joint different from the first joint; and
- the multilayer resin substrate further includes:
    - a second via-conductor in the second substrate and joined to the second joint; and
    - a second signal electrode on a same layer of the second substrate as the first floating electrode, the second signal electrode being joined to the second via-conductor.

19. The electronic component according to claim 18, further comprising:
- a second ground electrode on a same layer of the second substrate as the first floating electrode and the second signal electrode; wherein
- the first floating electrode and the second signal electrode have a distance between each other that is greater than a distance between the first floating electrode and the second ground electrode.

20. The electronic component according to claim 18, further comprising:
- a second ground electrode on a same layer of the second substrate as the first floating electrode and the second signal electrode; wherein
- the first floating electrode and the second ground electrode have a distance between each other that is greater than a distance between the first floating electrode and the second signal electrode.

* * * * *